United States Patent [19]
Öztürk et al.

[11] Patent Number: 5,439,850
[45] Date of Patent: Aug. 8, 1995

[54] METHOD FOR FORMING A LAYER OF UNIFORM THICKNESS ON A SEMICONDUCTOR WAFER DURING RAPID THERMAL PROCESSING

[75] Inventors: Mehmet C. Öztürk, Cary; Mahesh K. Sanganeria, Raleigh, both of N.C.

[73] Assignee: North Carolina State University, Raleigh, N.C.

[21] Appl. No.: 117,870

[22] Filed: Sep. 8, 1993

[51] Int. Cl.⁶ ............................................. H01L 21/00
[52] U.S. Cl. .................... 437/228; 437/233; 437/235; 437/239
[58] Field of Search ............. 118/728; 257/620, 622; 437/228, 233, 238, 239

[56] References Cited

U.S. PATENT DOCUMENTS

| | | | |
|---|---|---|---|
| 4,560,420 | 12/1985 | Lord | 148/1.5 |
| 4,877,573 | 8/1989 | Nilsson | 156/610 |
| 5,155,337 | 8/1992 | Serrell et al. | 219/411 |
| 5,212,394 | 5/1993 | Iwasaki et al. | 257/1 |
| 5,317,186 | 5/1994 | Wills et al. | 257/629 |

Primary Examiner—R. Bruce Breneman
Assistant Examiner—Matthew Whipple
Attorney, Agent, or Firm—Bell, Seltzer, Park & Gibson

[57] ABSTRACT

A ring is provided on a monocrystalline silicon wafer at one face thereof and adjacent the edge thereof. The ring increases the optical absorptivity of the wafer adjacent the ring compared to the optical absorptivity of the wafer distant from the ring. The ring therefore at least partially compensates for edge cooling of the wafer during rapid thermal processing thereof. Uniform thickness layers can therefore be deposited on a wafer in a rapid thermal processing system. When depositing polycrystalline silicon on an oxide covered layer, the ring may be formed as a circular trench in the oxide layer adjacent the wafer edge.

4 Claims, 4 Drawing Sheets

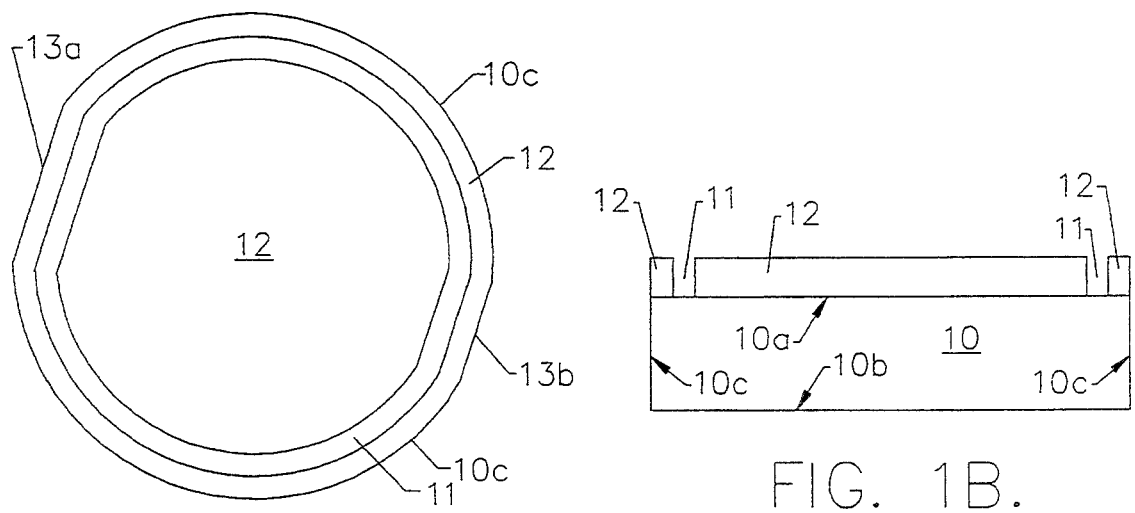
FIG. 1A.
FIG. 1B.
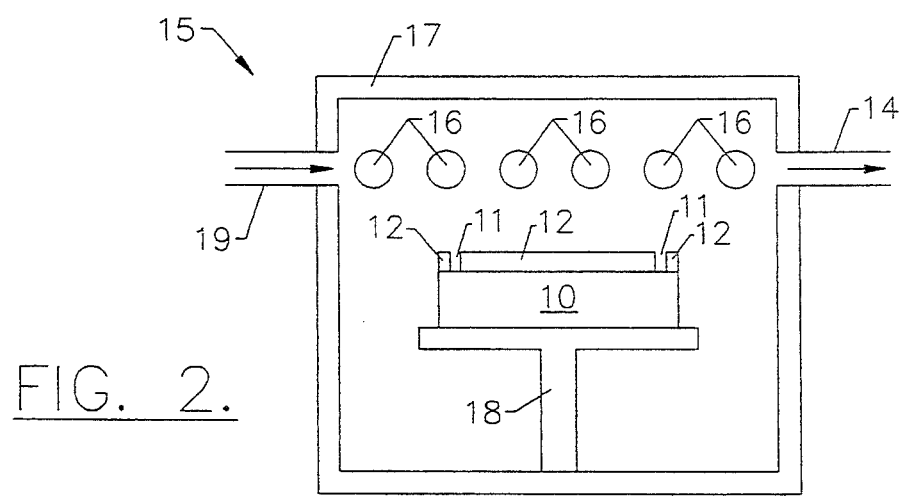
FIG. 2.
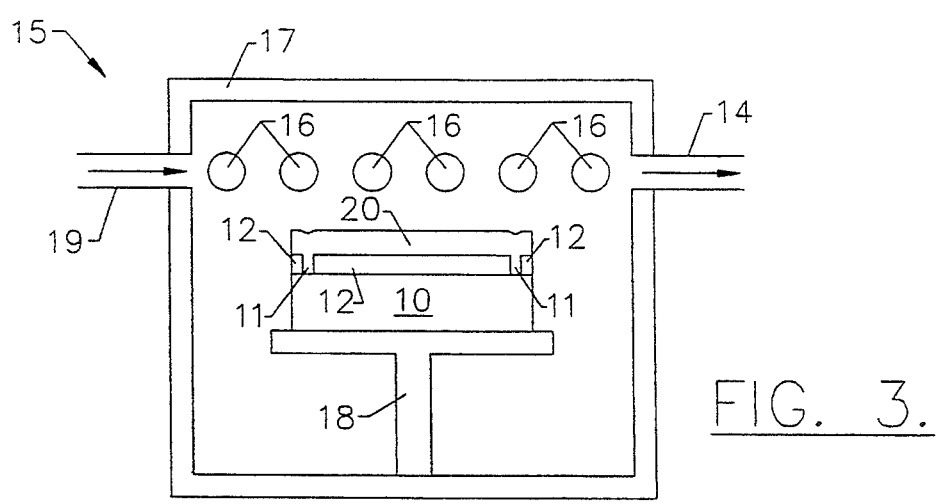
FIG. 3.

METHOD FOR FORMING A LAYER OF UNIFORM THICKNESS ON A SEMICONDUCTOR WAFER DURING RAPID THERMAL PROCESSING

FIELD OF THE INVENTION

This invention relates to microelectronic devices and manufacturing methods, and more particularly to rapid thermal processing method and systems for semiconductor wafers, and the wafers produced thereby.

BACKGROUND OF THE INVENTION

Rapid thermal processing (RTP) systems are increasingly being used for microelectronic device fabrication. As is well known to those having skill in the art, rapid thermal processing systems attain a desired processing temperature rapidly, without the need for a lengthy "ramp up" period. It has been found that rapid thermal processing systems allow microelectronic devices to be fabricated at high temperatures without causing dopant diffusion or other unwanted side effects.

In contrast with a conventional furnace which typically uses resistive heating units, a rapid thermal processing system typically uses radiant heat sources, for example arc discharge lamps or tungsten-halogen lamps. A small heating chamber is typically used, to provide a controlled environment for the wafer to be processed, and to efficiently couple the radiant heat energy from the radiant heat energy sources to the wafer. A rapid thermal processing system is described in U.S. Pat. No. 5,155,337 to Sorrell et al. entitled *Method and Apparatus for Controlling Rapid Thermal Processing Systems*, and assigned to the assignee of the present invention.

In semiconductor manufacturing, rapid thermal processing systems have been heretofore used for rapid thermal annealing and rapid thermal oxidation of semiconductor wafers. Attempts have recently been made to use rapid thermal processing systems for depositing layers on a semiconductor wafer, for example in chemical vapor deposition (CVD). This technique is referred to as "rapid thermal chemical vapor deposition" (RTCVD).

A known problem in rapid thermal processing systems is achieving a uniform temperature distribution across a large area wafer. Nonuniformity is typically caused by the larger surface area that exists around the wafer edge which leads to an excessive heat loss and temperature drop. See for example a publication by H. A. Lord entitled *Thermal and Stress Analysis of Semiconductor Wafers in a Rapid Thermal Processing Oven*, SPIE Proceedings on Rapid Isothermal Processing, Vol. 41, p. 1189 (1989) and a publication by Sorrell, Fordham, coinventor Öztürk and Wortman entitled *Temperature Uniformity in RTP Furnaces*, IEEE Transactions on Electron Devices, Vol. 39, p. 75 (1992).

Many solutions to the temperature nonuniformity problem have been proposed, which attempt to direct more radiation to the wafer edge or peripheral surface. See for example, U.S. patent application Ser. No. 07/953,568, now U.S. Pat. No. 5,253,324 to Wortman et al. entitled *Conical Rapid Thermal Processing Apparatus* and U.S. patent application Ser. No. 07/998,149 to Hauser et al. entitled *Triple Heating Rapid Thermal Processing Apparatus and Method*, both of which are assigned to the assignee of the present invention. These techniques have been quite successful, and RTP reactors are presently available with highly uniform temperature distributions across a large area wafer.

An additional uniformity degradation mechanism exists in rapid thermal chemical vapor deposition systems where a layer is deposited on a semiconductor wafer. The uniformity degradation mechanism is initiated by a small temperature variation across the wafer typically caused by edge cooling. The amount of light absorbed in a silicon wafer is determined by the wafer absorptivity weighted by the emission spectrum of the radiant heat lamp. The absorptivity is a strong function of the thickness and optical properties of the layers on the wafer surface. It has been found that a thin film deposition often dramatically changes the absorptivity of the wafer.

Accordingly, during rapid thermal chemical vapor deposition, once a nonuniform deposition pattern is established, the absorptivity and hence the temperature uniformity becomes strongly dependent upon the thickness uniformity. This causes the nonuniformity to increase with process time and the thickness of the deposited layer. A runaway situation therefore occurs where the absorptivity difference across the wafer continues to increase, thus resulting in greater increase of nonuniformity. This runaway condition is described in detail in a publication by the present inventors and F. Y. Sorrell entitled *A Uniformity Degradation Mechanism and Rapid Thermal Chemical Vapor Deposition*, Applied Physics Letters, Vol. 61, No. 22, pp. 2697–2699, November 1992, the disclosure of which is hereby incorporated herein by reference.

One thin film deposition process which is widely used in microelectronic device fabrication is deposition of a thin film of polycrystalline silicon (polysilicon) on a silicon dioxide layer on the surface of a silicon wafer. When an opaque polycrystalline silicon film is deposited on a transparent silicon dioxide layer at the silicon wafer surface, the absorptivity of the wafer changes dramatically as its surface changes.

When depositing polysilicon in an RTCVD reactor which is not capable of completely eliminating the edge cooling problem described above, a center-to-edge difference in polysilicon thickness can be established very quickly during the deposition process. In an RTCVD process, the wafer absorptivity is a function of the deposited layer thickness and therefore changes during the process. Therefore, if a thickness nonuniformity is developed on the wafer, the absorptivity becomes a function of this nonuniformity and hence varies across the wafer. Therefore, the uniformity continually degrades with increasing thickness and process time.

SUMMARY OF THE INVENTION

It is therefore an object of the present invention to provide a method for forming a layer of uniform thickness on the face of a semiconductor wafer during rapid thermal processing.

It is another object of the present invention to provide a method for forming a polycrystalline silicon layer of uniform thickness on the face of a semiconductor wafer during rapid thermal processing.

It is yet another object of the invention to provide a microelectronic substrate on which a thin film layer can be deposited uniformly in a rapid thermal processing system.

It is still another object of the present invention to provide a silicon wafer on which a polycrystalline silicon thin film can be deposited uniformly in a rapid thermal processing system.

These and other objects are provided according to the present invention by providing a ring on a monocrystalline silicon wafer at one face thereof and adjacent the edge thereof. The ring increases the optical absorptivity of the wafer adjacent the ring compared to the optical absorptivity of the wafer distant from the ring. The ring therefore at least partially compensates for edge cooling of the wafer during rapid thermal processing thereof. Accordingly, the ring shields edge cooling effects from the rest of the wafer. Uniform layers can therefore be deposited on the wafer in a rapid thermal processing system.

In a particular embodiment of the present invention for use in depositing polycrystalline silicon on an oxide covered wafer, the ring is formed as a circular trench in the oxide layer, adjacent the edge of the wafer. The trench is preferably between 200–500 $\mu$m wide. The circular trench preferably extends entirely through the oxide layer to expose the silicon wafer thereunder. The optical absorptivity of the wafer adjacent the circular trench is therefore increased compared to the optical absorptivity of the wafer distant from the circular trench. The circular trench therefore at least partially compensates for edge cooling of the wafer during rapid thermal processing thereof.

In a rapid thermal processing method according to the invention, a layer of uniform thickness is formed on the face of a monocrystalline semiconductor wafer by forming a ring on the wafer face adjacent the edge thereof. The ring increases the optical absorptivity of the wafer adjacent the ring compared to the optical absorptivity of the wafer distant from the ring. The wafer is radiantly heated while depositing the layer on the wafer face including the ring, such that the ring at least partially compensates for edge cooling of the wafer during radiant heating thereof. This method can be applied to the deposition of polycrystalline silicon on an oxide layer, including a circular trench adjacent the edge of the wafer, to produce a uniform polycrystalline silicon layer on the wafer face in a rapid thermal processing system. The method may also be applied to depositing other layers on a semiconductor wafer.

BRIEF DESCRIPTION OF THE DRAWINGS

FIGS. 1A and 1B illustrate a top view and a side cross-sectional view respectively, of a microelectronic substrate according to the present invention.

FIG. 2 illustrates the microelectronic substrate of FIGS. 1A and 1B in a rapid thermal processing system for depositing a layer thereon.

FIG. 3 illustrates the microelectronic substrate of FIG. 1 in the system of FIG. 2 after rapid thermal deposition of a layer thereon.

DETAILED DESCRIPTION OF PREFERRED EMBODIMENTS

Figure 4A:
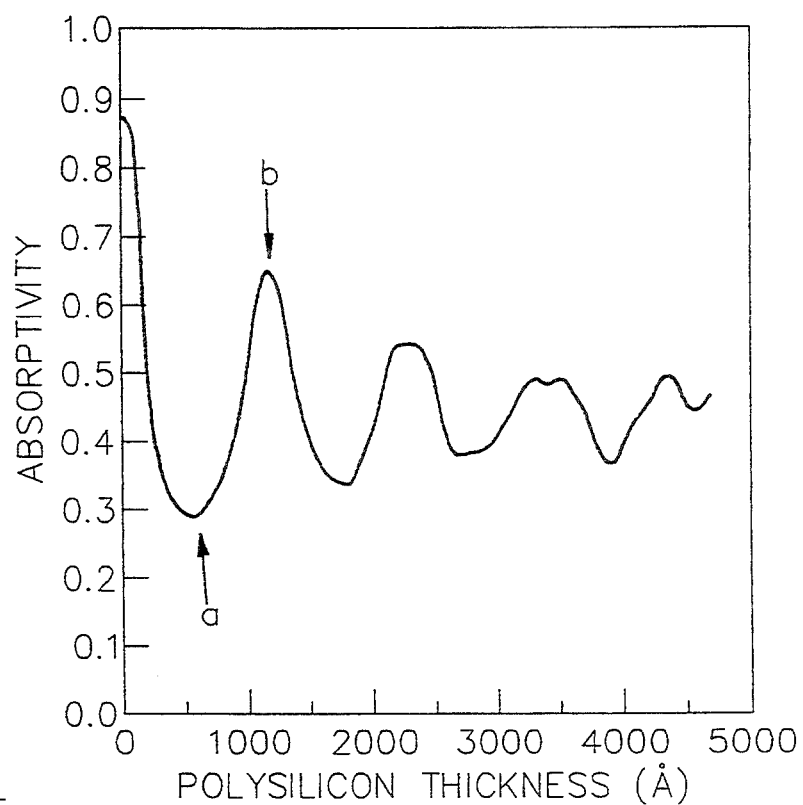
FIGS. 4A and 4B graphically illustrate calculated absorptivity of a polysilicon/silicon dioxide/silicon structure as a function of polysilicon thickness, and the lamp power required to achieve a wafer temperature of 650° C., respectively.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Referring now to FIGS. 1A and 1B, a microelectronic substrate according to the present invention is shown. As shown in FIG. 1A, microelectronic substrate includes a monocrystalline semiconductor wafer 10 such as a silicon, gallium arsenide or other semiconductor material. As is known to those skilled in the art, the wafer typically has a pair of opposing faces 10a, 10b and a cylindrical edge surface 10c therebetween.

According to the invention, a ring 11 is formed on the wafer at one face 10a thereof adjacent the edge surface 10c. The ring 11 increases the optical absorptivity of the wafer 10 adjacent the ring compared to the optical absorptivity of the wafer distant from the ring. The ring therefore at least partially compensates for edge cooling of the wafer during rapid thermal processing thereof. The ring 11 is preferably between about 200 $\mu$m to about 500 $\mu$m wide and is preferably as close to wafer edge 10c as is possible. In fact, the ring 11 may be formed at the wafer edge 10c. It will also be understood by those having skill in the art that wafer edge 10c typically includes one or more flat regions 13a, 13b for orientation or other purposes. Ring 11 preferably follows the contour of edge 10c including any flat regions 13a, 13b, so that ring 11 is typically not a perfect circle.

As shown in FIG. 1B, the ring 11 may be fabricated as a circular trench in an oxide layer 12 such as a silicon dioxide layer, adjacent the edge surface 10c of the wafer 10. Ring 11 may also be formed at edge surface 10c by removing the outermost portion of oxide layer 12. In this case, the ring 11 has an imaginary outer wall.

As also shown in FIG. 1B, the trench preferably extends entirely through oxide layer 12 to expose the first face 10a of the wafer 10 thereunder. For example, when fabricating transistors on wafer 10, field oxide regions are typically formed by forming a uniform oxide layer 12 on face 10a, and patterning the oxide layer. Ring 11 may be patterned during this step.

Referring now to FIG. 2, a layer of uniform thickness is deposited on the wafer 10 by inserting the wafer into a rapid thermal processing system 15. As is well known to those having skill in the art, rapid thermal processing system 15 includes a rapid thermal processing chamber 17 which may be fabricated of stainless steel and which includes an inlet 19 and an outlet 14 for flowing the requisite gases through 10 chamber 17 at high or low pressures, to thereby perform rapid thermal chemical vapor deposition (RTCVD) of a layer on wafer 10. A wafer support 18 supports wafer 10 in chamber 17.

A radiant heat source 16 such as an arc discharge lamp or a plurality of tungsten-halogen lamps, rapidly heat the wafer 10 in chamber 17. The lamp or lamps may be located within or outside the chamber. It will be understood by those having skill in the art that heat lamps 16 are preferably connected to a controller which may also control the flow of gases through inlet 19 and outlet 14. Many configurations of rapid thermal processing systems 15 are commercially available. Accordingly the design of the rapid thermal processing system need not be described further herein.

Referring now to FIG. 3, a layer such as polycrystalline silicon (polysilicon) is formed on oxide layer 12 including the circular trench therein. Polycrystalline silicon layer 20 is formed by simultaneously energizing the radiant heat sources 16 while flowing the requisite gases through inlet 19 and outlet 14. Rapid thermal chemical vapor deposition of polycrystalline silicon may take place using 10% $Si_2H_6$ diluted in a carrier gas of $H_2$ at 650° C. at a total constant pressure of 0.10 Torr.

It will be understood by those having skill in the art that ring 11 may be formed by etching into wafer face 10a, or by depositing a ring of predetermined material on wafer 10. Alternatively, the ring may be deposited on, or etched in, a layer on wafer 10. Thus, for example, a polycrystalline silicon ring may be formed on an oxide layer prior to blanket deposition of the polysilicon layer. Other ring configurations which increase the optical absorptivity of the wafer adjacent C the ring compared to the optical absorptivity of the wafer distant from the ring, may be provided. It will also be understood that layers other than polycrystalline silicon may be deposited.

EXAMPLE

In order to demonstrate the formation of a layer of uniform thickness on a wafer, four inch wafers 10 were used with different thickness silicon dioxide ($SiO_2$) layers 12 existing only on the front face 10a. The oxide layer on the back face 10b was etched away in order to use this face for temperature measurement via pyromerry. The assumption made was that polysilicon deposition on bare silicon would have a negligible effect on the back face emissivity. For wafers including the ring, conventional photolithography was used to etch a thin oxide ring at the wafer edge 10c.

Polysilicon depositions were performed in an ultra-high vacuum RTCVD silicon epitaxy reactor, as illustrated conceptually in FIGS. 2 and 3. In this reactor, the depositions are carried out in a water-cooled stainless steel process chamber 17. The wafer was placed on a quartz wafer support 18 with the front face facing up, and was heated by a Peak Systems ™ LXU-35 arc lamp 16 through a quartz window. A pyrometer with a center wavelength of 2.2 $\mu m$ was used through a sapphire viewport for temperature measurement. Polysilicon depositions were carried out using 10% $Si_2H_6$ diluted in a carrier gas of $H_2$. The total pressure was kept constant at 0.10 Torr. During deposition, wafer rotation at 30 rpm was used in order to obtain a circular symmetry in temperature nonuniformity.

Figure 4B:
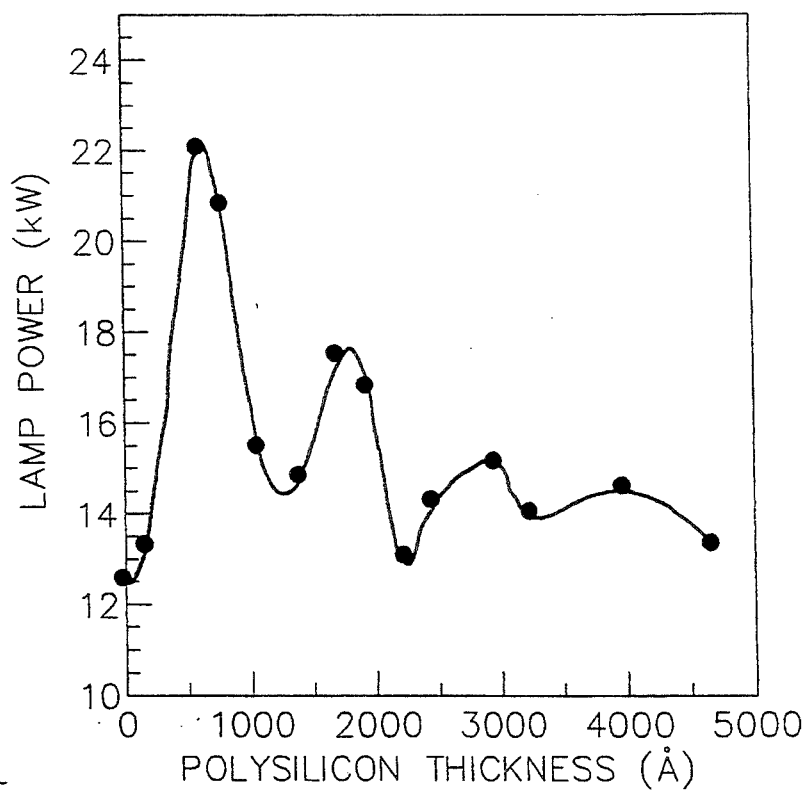

FIG. 4A graphically illustrates absorptivity of the polysilicon/oxide (1000 Å)/silicon structure as a function of the polysilicon thickness. The behavior shown in FIG. 4A establishes the basis for the uniformity degradation mechanism during RTCVD. FIG. 4B shows the amount of lamp power necessary to bring the wafer temperature to 650° C. as a function of polysilicon thickness. The data was obtained from four inch silicon wafers which already had an existing layer of "uniform" polysilicon (with different thicknesses) deposited in a conventional CVD reactor. Polysilicon films were deposited on 1000 Å thermally grown $SiO_2$ which existed only on the polished front face. As expected, FIG. 4B is a mirror image of the absorptivity data shown in FIG. 4A. As shown, small differences in polysilicon thickness can result in significant differences in absorptivity and lamp power requirements.

Referring again to FIG. 4A, two points labeled "a" and "b" are shown. Suppose a thin layer of polysilicon is deposited to approach point "a" on the absorptivity curve. Assuming that a somewhat thinner deposition has taken place around the wafer edge due to improper compensation of the edge cooling effect, then the wafer edge is absorbing more than the wafer center. This can be viewed as a negative feedback mechanism which can lead to some compensation of the edge cooling effect.

Unfortunately, similar reasoning applies for point "b" where the absorptivity curve has a positive slope. Again, assuming that polysilicon deposited around the edge is thinner and hence possesses a different absorptivity than the center, an undesirable situation is produced in which the thinner edge is absorbing less radiation than the thicker center. Such a condition can only tend to increase the existing nonuniformity and possibly lead to an undesirable temperature uniformity runaway situation.

Figure 5:
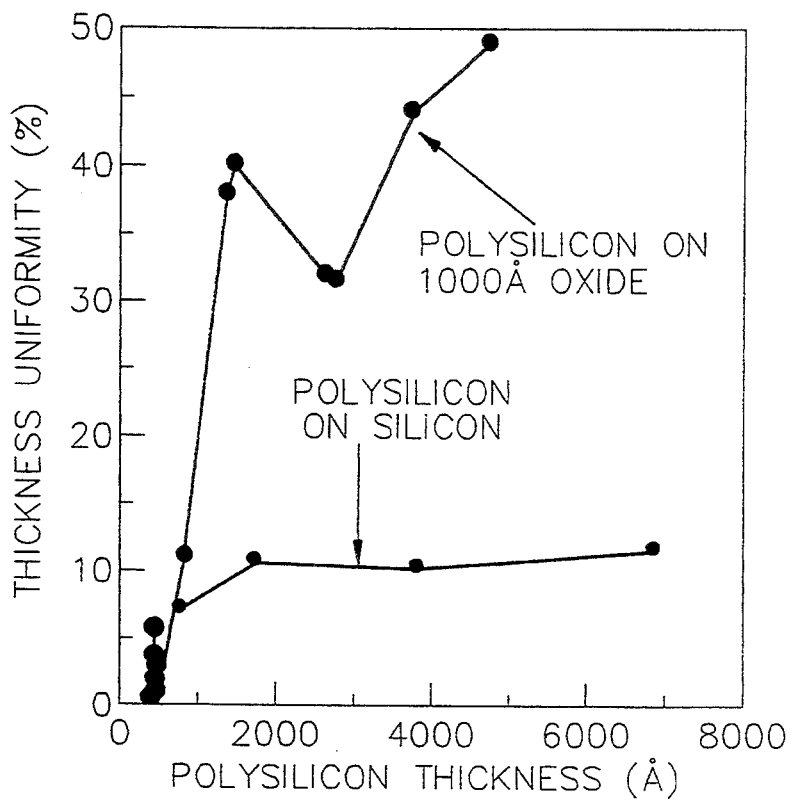
FIG. 5 graphically illustrates polysilicon uniformity on silicon and oxide as a function of polysilicon thickness.

To verify this mechanism experimentally, polysilicon was deposited on $SiO_2$ to several different thicknesses. The deposition nonuniformity was then measured for each polysilicon thickness. The results of this experiment are shown in FIG. 5. Also shown in FIG. 5 is the measured thickness uniformity when polysilicon is deposited directly on silicon without an intermediate oxide layer.

To directly deposit polysilicon, a lithographic mask was used to create seven isolated $SiO_2$ islands of 2 mm × 4 mm size on a bare silicon wafer. It is assumed that these small oxide islands would perturb the wafer absorptivity only in a negligible manner. The islands were used to measure the amount of deposited polysilicon at seven equally spaced points positioned on a straight line across the wafer. Figure 5 clearly shows that when polysilicon is deposited on $SiO_2$, the deposition uniformity is a strong function of the polysilicon thickness. On the other hand, approximately the same uniformity (about 10%) is obtained when polysilicon is deposited directly on Si regardless of its thicknesses. Assuming an Arrhenius type behavior and an activation energy of 1.6 eV, it can be shown that at the deposition temperature of 650° C., the thickness uniformity obtained on bare wafers corresponds to a temperature difference of approximately 5° C., which is a fairly small difference.

As shown, when the total polysilicon thickness is less than approximately 500 Å, the uniformity is better than that obtained on bare silicon wafers. According to the data shown in FIGS. 4A and 4B, in this region, the thinner edge absorbs more radiation than the thicker center and leads to a correction or negative feedback mechanism. When the polysilicon thickness exceeds 500 Å, a positive feedback region is entered in which the uniformity degrades very rapidly. Even though some improvement is obtained in the second negative feedback region above 2000 Å, it is not sufficient to rectify the extreme nonuniformity created up to 2000 Å. Consequently, this leads to a situation in which the uniformity continually degrades with increasing film thickness.

According to the invention, the absorptivity of the wafer perimeter is modified by etching a thin ring in the thick isolation oxide on which polysilicon is to be deposited. The ring creates a region which does not suffer from the absorptivity modulation that In this occurs when polysilicon is deposited on oxide region, as demonstrated in FIGS. 4A and 4B, polysilicon is deposited on the exposed silicon resulting in a high absorptivity that does not change with the amount of polysilicon deposited.

Figure 6:
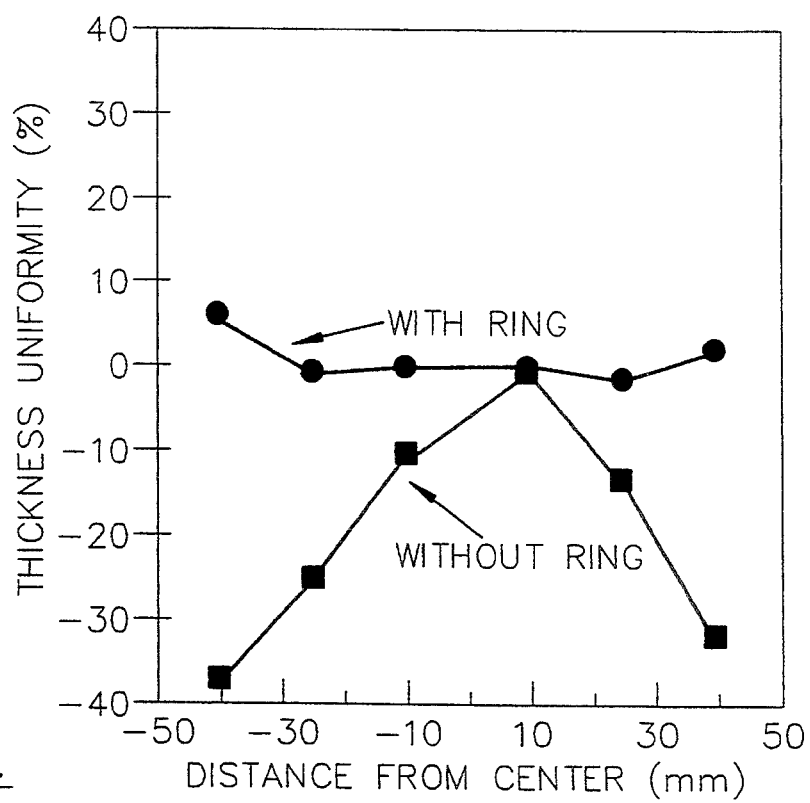
FIG. 6 illustrates the effect of a ring on the uniformity of polysilicon on 1200 Å of oxide, according to the invention.

FIG. 6 graphically illustrates the effect of the ring on 2000 Å polysilicon deposited on 1200 Å of oxide at 650° C. The width of the ring used in this experiment is 200 μm, and it is placed as close to the wafer edge as possible.

As shown, the ring changes the uniformity significantly, resulting in a thickness nonuniformity of about 5% compared to about 40% without the ring. In fact, with the ring, polysilicon is thicker at the edge. Increasing the thickness of ring beyond 200 μm progressively degraded the uniformity in the opposite direction, i.e., a thicker film was obtained at the wafer edge than in the center. Therefore, the ring thickness should be optimized to obtain optimum performance.

For optimization, the changes in uniformity pattern as polysilicon is deposited on oxide with the ring are considered. During deposition, the absorptivity of the wafer changes with the polysilicon thickness, whereas the absorptivity of the ring region remains higher and unaltered. For the initial 500 Å of polysilicon deposition, the negative feedback is so strong that uniform polysilicon is deposited irrespective of ring size, including absence of the ring, corresponding to point "a" in FIG. 4A. At point "a", the absorptivity of the ring remains unchanged and is relatively high, whereas for the rest of the wafer the absorptivity is very low. This results in a situation where the temperature of the ring is significantly higher. It should be noted that the ring width can also be varied to provide the necessary heat to compensate for the positive feedback between points "a" and "b" in the absorptivity curve which is responsible for the most of the degradation.

Figure 7A:
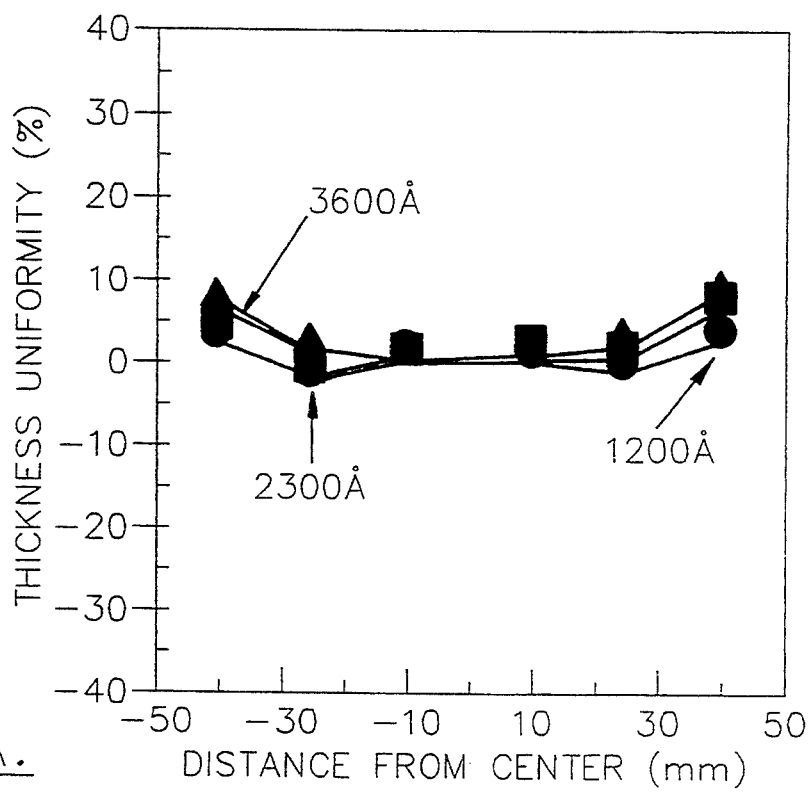
FIGS. 7A and 7B graphically illustrate the effect of oxide thickness and deposition temperature, respectively, on the thickness uniformity of polysilicon using a 200 $\mu$m wide ring according to the invention.

Thus, the thickness of the ring should be experimentally optimized to obtain uniformity for different processing conditions, such as deposition temperature, polysilicon thickness desired., and underlying oxide thickness. FIG. 7A shows the effect of underlying oxide thickness on uniformity using the ring. A 200 μm ring was used for polysilicon deposition at 700° C. As shown, no strong dependence is observed. It appears that as oxide thickness is increased, a slightly thinner ring thickness may provide the best results.

Figure 7B:
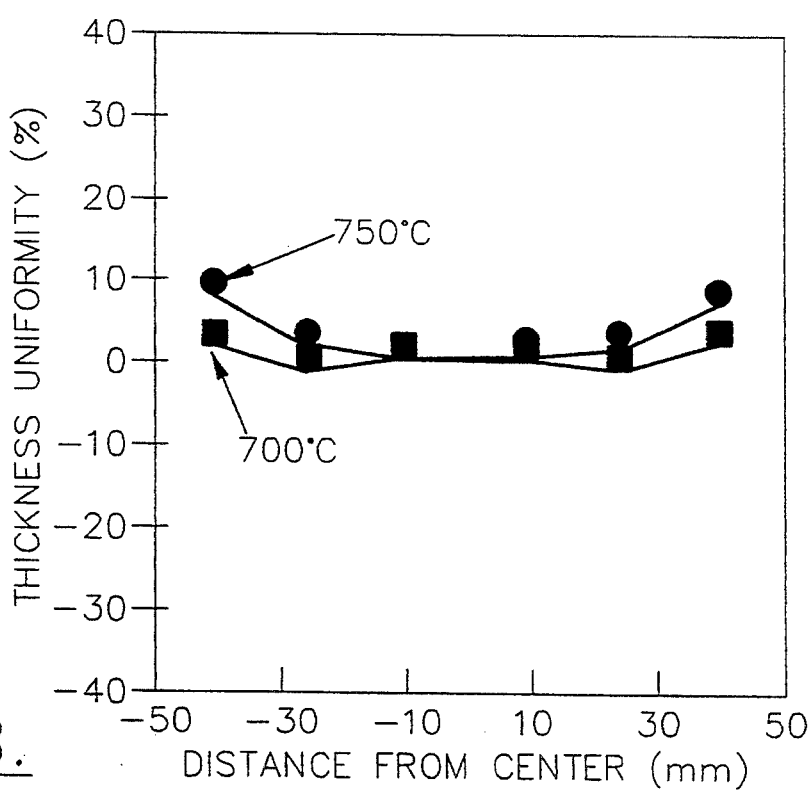

FIG. 7B illustrates the effect of deposition temperature on the uniformity pattern. A 200 μm wide ring in an oxide layer 2300 Å thick was used. Again, changing the deposition temperature does not significantly change the uniformity pattern.

To summarize, intrinsic temperature nonuniformity coupled with thickness dependent absorptivity of multilayer structures can severely degrade film uniformity during RTCVD. Due to variations in the absorptivity across the wafer, the nonuniformity of deposited films can far exceed the intrinsic temperature nonuniformity of the RTP system. While these effects can be minimized by optimum reflector and chamber design, the ring of the present invention provides a practical solution which can be easily applied to polysilicon deposition in RTCVD systems that cannot fully compensate for the edge losses.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method for forming a polycrystalline silicon layer of uniform thickness on a face of a monocrystalline silicon wafer comprising the steps of:

forming an oxide layer on said wafer face, said oxide layer including a circular trench adjacent the edge thereof, for increasing the optical absorptivity of said wafer adjacent said circular trench compared to the optical absorptivity of said wafer distant from said circular trench; and radiantly heating said wafer while depositing said polycrystalline silicon layer on said wafer face including said circular trench, such that said circular trench at least partially compensates for edge cooling of said wafer during radiant heating thereof.

2. The method of claim 1 wherein said oxide layer forming step comprises the step of forming an oxide layer including a circular trench extending therethrough.

3. The method of claim 1 wherein said step of radiantly heating while depositing is performed in a rapid thermal processing system.

4. The method of claim 1 wherein said oxide layer forming step comprises the step of forming an oxide layer including a circular trench at an edge of said wafer.

* * * * *

UNITED STATES PATENT AND TRADEMARK OFFICE
CERTIFICATE OF CORRECTION

PATENT NO. : 5,439,850
DATED : August 8, 1995                      Page 1 of 2
INVENTOR(S) : Öztürk et al.

It is certified that error appears in the above-identified patent and that said Letters Patent is hereby corrected as shown below: Title page:

Item

[56] <u>References Cited</u>:

<u>Under U.S. Patents</u>:

U.S. Patent 4,877,573 issued --10/1989-- not "8/1989".
    U.S. Patent 5,155,337 issued --10/1992-- not "8/1992" to --Sorrell et al.-- not "Serrell et al.".

<u>Other Publications</u>:

The following publications listed in a "Citation Under 37 CFR 1.97" filed September 8, 1993 were omitted from the face of the patent:

Sorrell et al., *"Temperature Uniformity in RTP Furances [sic]"*, IEEE Transactions on Electron Devices, Vol. 39, No. 1, January 1992, pp. 75-80.

Vandenabeele et al., *"Impact of Patterned Layers on Temperature Non-Uniformity During Rapid Thermal Processing for VLSI-Applications"*, Mat. Res. Soc. Symp. Proc., Vol. 146, 1989, pp. 149-160.

Öztürk et al., *"A Uniformity Degradation Mechanism in Rapid Thermal Chemical Vapor Deposition"*, Appl. Phys. Lett. 61 (22), November 1992, pp. 2697-2699.

Lord, *"Thermal and Stress Analysis of Semiconductor Wafers in a Rapid Thermal Processing Oven"*, SPIE, Vol. 1189, Rapid Isothermal Processing (1989), pp. 41-54.

UNITED STATES PATENT AND TRADEMARK OFFICE
CERTIFICATE OF CORRECTION

PATENT NO. : 5,439,850
DATED : August 8, 1995
INVENTOR(S) : Öztürk et al.

It is certified that error appears in the above-identified patent and that said Letters Patent is hereby corrected as shown below:

In the Specification:

Column 1, lines 63-64, "Apparatu-sand" should be --Apparatus and--.
Column 4, line 62, delete "10".
Column 5, line 16, "$Si_2H_6$diluted" should be --$Si_2H_6$ diluted--.
Column 5, line 26, delete "C".
Column 5, lines 38-39, "pyromerry" should be --pyrometry--.
Column 6, line 36, "$SiO_2$islands" should be --$SiO_2$ islands--.
Column 7, line 5, delete the return and "In this".
Column 7, line 6, after "oxide" insert --.--.
Column 7, line 7, before "region" insert --In this--.
Column 7, line 49, after "desired" delete --.--.

Signed and Sealed this

Sixteenth Day of July, 1996

Attest:

BRUCE LEHMAN

Attesting Officer     Commissioner of Patents and Trademarks